(12) United States Patent
Caclard

(10) Patent No.: US 9,668,388 B2
(45) Date of Patent: May 30, 2017

(54) ELECTRONIC UNIT WITH A PCB AND TWO HOUSING PARTS

(75) Inventor: Laurent Caclard, Touffreville (FR)

(73) Assignee: AUTOLIV DEVELOPMENT AB, Vargarda (SE)

( * ) Notice: Subject to any disclaimer, the term of this patent is extended or adjusted under 35 U.S.C. 154(b) by 63 days.

(21) Appl. No.: 14/381,640

(22) PCT Filed: Mar. 1, 2012

(86) PCT No.: PCT/SE2012/050232
§ 371 (c)(1),
(2), (4) Date: Aug. 28, 2014

(87) PCT Pub. No.: WO2013/129982
PCT Pub. Date: Sep. 6, 2013

(65) Prior Publication Data
US 2015/0009642 A1    Jan. 8, 2015

(51) Int. Cl.
*H05K 5/00* (2006.01)
*H05K 9/00* (2006.01)
(Continued)

(52) U.S. Cl.
CPC ......... *H05K 9/0039* (2013.01); *H05K 1/0215* (2013.01); *H05K 1/0218* (2013.01); *H05K 5/0047* (2013.01); *H05K 7/1427* (2013.01); *H05K 2201/0723* (2013.01); *H05K 2201/0919* (2013.01); *H05K 2201/1003* (2013.01); *H05K 2201/10015* (2013.01); *H05K 2201/10371* (2013.01); *H05K 2201/10507* (2013.01)

(58) Field of Classification Search
CPC .. H05K 5/0047; H05K 5/0052; H05K 5/0056; H05K 5/006; H05K 2203/1581
See application file for complete search history.

(56) References Cited

U.S. PATENT DOCUMENTS 5,253,143 A * 10/1993 Klinger ............... H05K 5/0247
361/736
5,273,459 A * 12/1993 Davis ............... H01R 13/65802
439/607.48

(Continued)

FOREIGN PATENT DOCUMENTS

EP    WO 2011/069828 A1    6/2011

OTHER PUBLICATIONS

International Search Report and Written Opinion—Jun. 12, 2012.

*Primary Examiner* — Adrian S Wilson
(74) *Attorney, Agent, or Firm* — Brinks Gilson & Lione

(57) ABSTRACT

An electronic unit (1) having a circuit board, PCB, (2) arranged to be mounted in a main housing (6, 7 and having a first housing part (6) and a second housing part (7), where the first housing part (6) is at least partly electrically conducting. The PCB (2) having a first outer layer (3), a second outer layer (4), and a ground plane (5). The first outer layer (3) faces the first housing part (6) and the second outer layer (4) faces the second housing part (7) The ground plane (5) is in electrical contact with the first housing part (6) forming a first chamber (29), facing the first outer layer (3), and a second chamber (30), facing the second outer layer (4). The chambers (29, 30) are separated by the ground plane (5), providing electromagnetic shielding between the chambers (29, 30).

12 Claims, 3 Drawing Sheets

Section A-A

(51) Int. Cl.
*H05K 1/02* (2006.01)
*H05K 7/14* (2006.01)

(56) References Cited

U.S. PATENT DOCUMENTS

| | | | |
|---|---|---|---|
| 5,392,197 A | 2/1995 | Cuntz et al. | |
| 5,418,685 A * | 5/1995 | Hussmann | H05K 1/0209 |
| | | | 174/377 |
| 5,473,109 A | 12/1995 | Plankl et al. | |
| 5,500,789 A | 3/1996 | Miller et al. | |
| 6,016,083 A | 1/2000 | Satoh | |
| 7,184,273 B2 * | 2/2007 | Sakai | H05K 5/0039 |
| | | | 361/728 |
| 7,234,352 B2 * | 6/2007 | Mitani | G01C 19/5628 |
| | | | 439/76.2 |
| 7,249,957 B2 * | 7/2007 | Watanabe | H01R 12/7064 |
| | | | 439/79 |
| 7,269,033 B2 * | 9/2007 | Berberich | H01R 13/6625 |
| | | | 361/761 |
| 8,199,514 B2 | 6/2012 | Ito | |
| 2004/0001325 A1 * | 1/2004 | Wang | H05K 3/0052 |
| | | | 361/762 |
| 2008/0049949 A1 * | 2/2008 | Snider | H04B 1/082 |
| | | | 381/86 |

* cited by examiner

Section A-A

ELECTRONIC UNIT WITH A PCB AND TWO HOUSING PARTS

CROSS REFERENCE TO RELATED APPLICATIONS

This application claims priority to International Application No. PCT/SE2012/050232, filed Mar. 1, 2012.

BACKGROUND AND INTRODUCTORY DESCRIPTION OF THE INVENTION

The present invention relates to an electronic unit having a circuit board (PCB) arranged to be mounted in a main housing. The main housing has a first housing part and a second housing part, where the first housing part at least partly is electrically conducting. The PCB has a first outer layer, a second outer layer and a ground plane, where the first outer layer mainly faces the first housing part and the second outer layer mainly faces the second housing part when mounted.

In several technical fields, for instance in the control of electrical systems on board a motor vehicle, it is desirable to provide a sealed housing with a cover containing a PCB (Printed Circuit Board), onto which are mounted several electronic components. Such a sealed housing containing a PCB with electronic components is for example known as an ECU (Electronic Control Unit). The sealed housing with its cover protects the PCB and its components against mechanical damage and various environmental influences.

It is also desirable to obtain electromagnetic shielding or to improve EMC (Electromagnetic Compatibility). For example, the PCB is normally provided with a plug connector for making electrical contact between the ECU and other parts of the vehicle when mounted. Such a connector is a source of EMI (Electromagnetic Interference) since the connector's leads act as antennas that both transmit and receive signals, and it is therefore desired to keep the connector separates from components sensitive to EMI as well as components which emit EMI.

In U.S. Pat. No. 5,392,197 it is disclosed that the housing and its cover may be made in metal in order to shield all components of the ECU.

However, here no shielding between separate components which may disturb each other is disclosed, and the metal housing and cover is expensive and bulky.

In WO 2011069828 it is disclosed to use separate metal covers that shield certain components, which covers also may act as thermal conductors for heat dissipation.

However, here a number of separate metal covers that are specially shaped and need special mounting are needed.

There is thus a need for an ECU with an EMI shielding that is more versatile than prior solutions and which is uncomplicated to assemble, neither inflicting higher material costs, nor causing a more complicated assembly.

It is therefore an object of the present invention to provide an ECU with an EMI shielding that is more versatile than prior solutions and which is uncomplicated to assemble, neither inflicting higher material costs, nor causing a more complicated assembly.

This object is achieved by means of an electronic unit having a circuit board (PCB) arranged to be mounted in a main housing. The main housing has a first housing part and a second housing part, where the first housing part at least partly is electrically conducting. The PCB has a first outer layer, a second outer layer and a ground plane, where the first outer layer mainly faces the first housing part and the second outer layer mainly faces the second housing part when mounted. Furthermore, when mounted, the ground plane is arranged to make electrical contact with the first housing part such that a first chamber, facing the first outer layer, and a second chamber, facing the second outer layer, are formed, where said chambers are separated by means of the ground plane, such that an electromagnetic shielding is created between the chambers.

According to an example of the present invention, the first housing part is made in a metal material and the second housing part is made in a plastic material.

According to another example of the present invention, the electronic unit further has a connector arranged for establishing electrical contact between the electronic unit and parts outside the electronic unit. The connector has a number of connector pins and at is least partly positioned in the second chamber. Preferably, the connector is press-fitted between the first housing part and the second housing part, and an electromagnetic interference (EMI) filter arrangement may be positioned at the connector pins.

According to another example of the present invention, a first plurality of components is mounted on the first outer layer and a second plurality of components is mounted on the second outer layer. All components of one layer are mounted in a re-flow process and at least one component on the other layer is mounted by means of another process. Said other process is for example one of press-fit, gluing or bonding.

Further examples of the invention are described in this specification.

A number of advantages are obtained by means of the present invention, for example an EMI shielding may be obtained without increasing the number of parts used for the electronic unit.

BRIEF DESCRIPTION OF THE DRAWINGS

The present invention will now be described more in detail with reference to the appended drawings, where.

DETAILED DESCRIPTION

Figure 1:
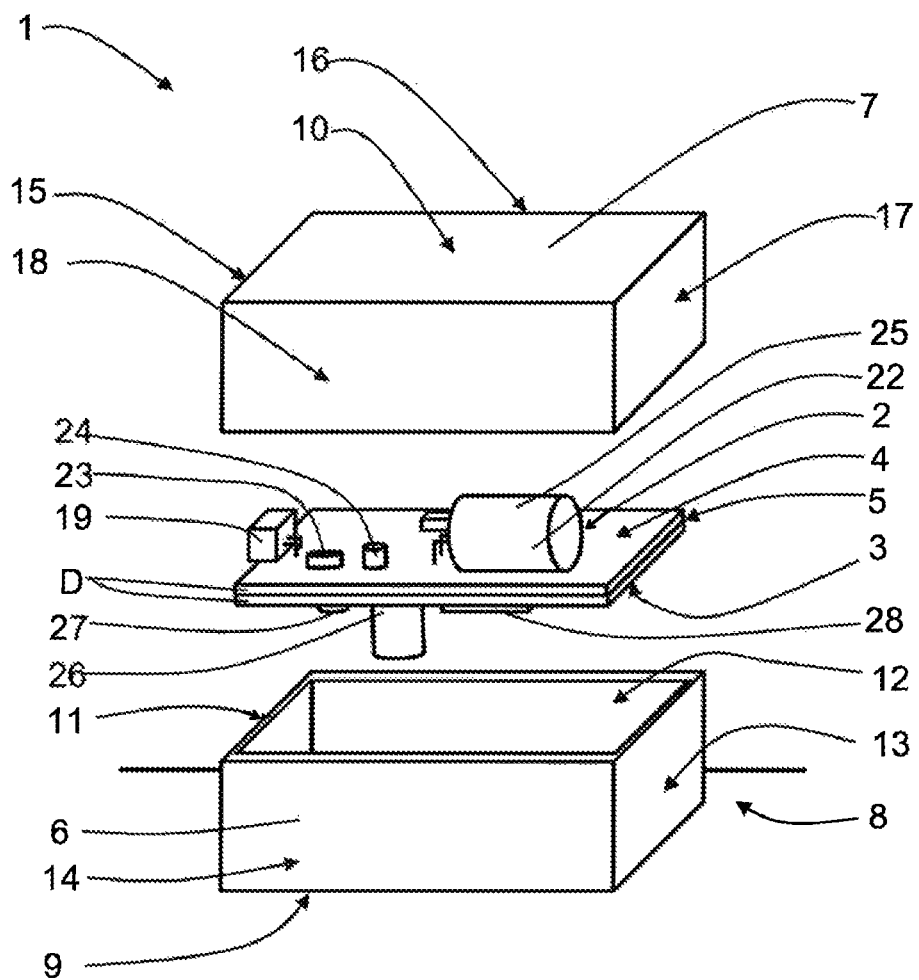
FIG. 1 shows a schematical perspective view of an electronic unit before mounting.
Figure 2:
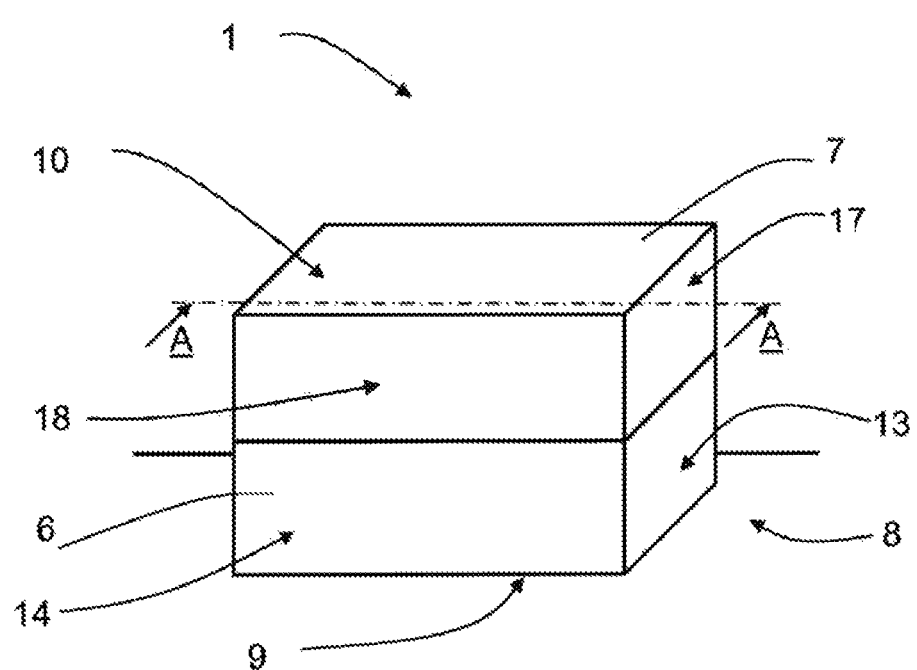
FIG. 2 shows a schematical side view of the electronic unit after mounting.
Figure 3:
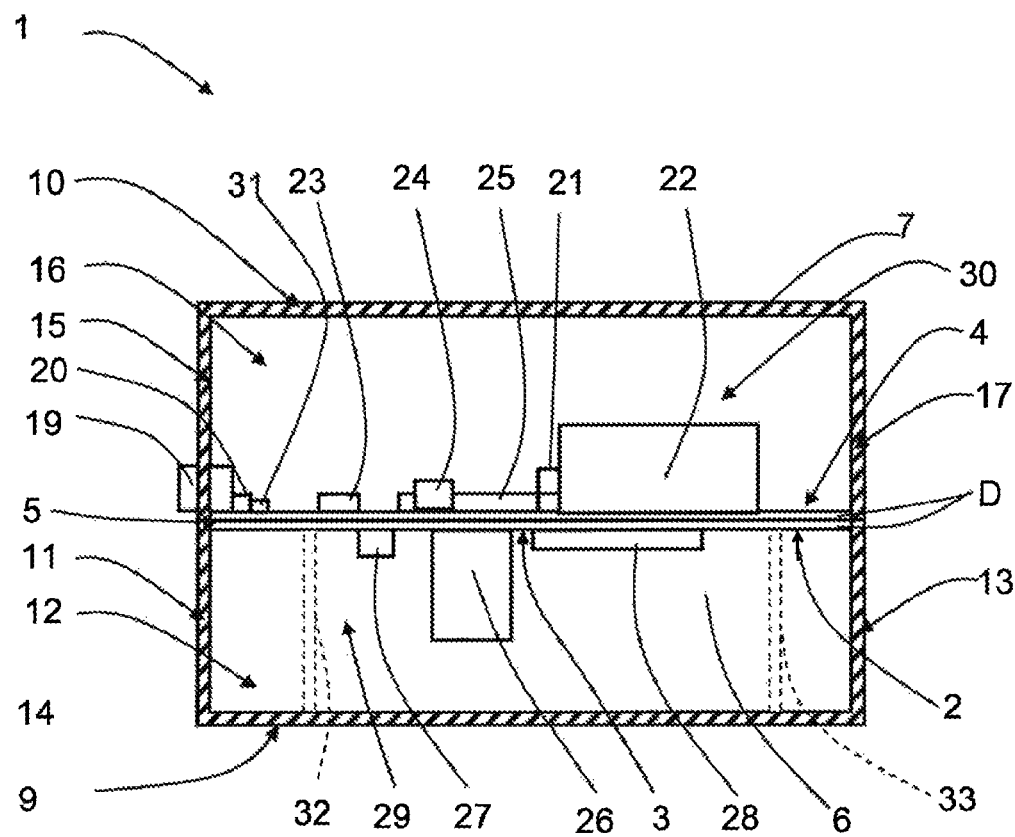
FIG. 3 shows a schematical cross-sectional side view of the electronic unit after mounting.

With reference to FIG. 1, FIG. 2 and FIG. 3, an electronic unit 1 is shown. FIG. 1 shows a perspective view of the unassembled electronic unit 1, FIG. 2 shows a perspective view of the assembled electronic unit 1 and FIG. 3 shows a cross-section of FIG. 2, such that the interior of the assembled electronic unit 1 is shown. The electronic unit 1 may be a part of a control system in a vehicle and has electronic components and a connector, which will be described more in detail below.

The electronic unit 1 has a printed circuit board 2 (PCB). The PCB 2 is of an ordinary kind having three electrically conductive layers: a first outer layer 3, a second outer layer 4, and a central layer 5, the outer layers 3, 4 being separated from the central layer 5 by a dielectric material D such as glass-fibre. The outer layers 3, 4 are constituted by conductive tracks and component connections and the central layer 5 is constituted by a ground plane. Each conductive layer 3, 4, 5 is in the form of a copper cladding, where copper has been removed by means etching on the outer layers in order to form the conductive tracks and component connections.

There are other methods for establishing conductive tracks and component connections which are well-known in the art, such as for example screen-printing.

The electronic unit 1 further has a first housing part 6 and a second housing part 7, where the first housing part 6 is made in metal and is mounted to a part 8 of a vehicle. To facilitate mounting, the first housing part 6 may comprise flanges with attachment holes (not shown).

Each housing partHousing parts 6, 7 has a first wall 9 and 10 respectively, parallel with, and facing away from, the PCB 2. Housing part 6 has corresponding side walls 11, 12, 13, 14; and housing part 7 has corresponding side walls 15, 16, 17, 18 to define an inner space having a substantially rectangular cross-section.

When the PCB 2 is mounted, the first outer layer 3 mainly faces the first housing part 6 and the second outer layer 4 mainly faces the second housing part 7, the housing parts 6, 7 together forming a main housing 6, 7 which protects the PCB 2 and its components against mechanical damage and various environmental influences.

On the second outer layer 4, a plug connector 19 for making electrical contact between the electronic unit 1 and parts outside the electronic unit 1 is mounted, the connector 19 having a number of connector pins 20. Although only one connector pin 20 is indicated in FIG. 1 for reasons of clarity, it is referring to a number of connector pins. Furthermore, on the second outer layer 4, a first capacitor 22, a second capacitor 23, a third capacitor 24 and a resistor 25 are mounted. On the first outer layer 3, an inductor 26, a capacitor 27 and a clock signal circuit 28 are mounted.

According to the present invention, the central layer 5 is arranged to make electrical contact with the first housing part 6 such that a first chamber 29, facing the first outer layer 3, and a second chamber 30, facing the second outer layer 4, are formed, where said chambers 29, 30 are separated by means of the central layer 5 and electromagnetically shielded from each other with respect to EMI (Electromagnetic Interference).

The second housing part 7 is made of a sturdy, insulating material such as a plastics material, which results in that the second chamber 30 is electromagnetically shielded with respect to the first chamber 29, but not with respect to the outside of the electronic unit 1. The first chamber 29, on the other hand, is electromagnetically shielded from EMI outside the electronic unit 1 which is prevented from entering the first chamber 29. In the same way, EMI produced in the first chamber 29 is prevented from leaving the first chamber 29.

When the first housing part 6 is mounted to a vehicle, the metal it is made of provides a required fixation which prevents disturbance to for example accelerometers and similar devices (not shown) that may be comprised in the electronic unit 1.

In order to prevent EMI to enter the electronic unit 1 via the connector 19, and to prevent EMI to travel between the connector pins 20, an EMI filter arrangement 31 is positioned at the connector pins 20 as shown in FIG. 3. The EMI filter arrangement 31 may for example be constituted by one or several small capacitors, and is well-known in the art.

The components 26, 27, 28 on the first outer layer 3 and some components on the second outer layer 4 are attached to the PCB 2 by means of two passes in a re-flow process, which is well-known in the art.

During such a process, first, solder paste which has an adhesive function is placed on one outer layer of the PCB 2 where the components should be attached on that outer layer. Then the components are positioned on the outer layer in question by means of a pick-and-place machine such that the components' connectors are positioned in the solder paste. Finally, the PCB 2 is transported through a heating process with the outer layer in question facing upwards, where the solder paste first is melted and then hardened such that the components now are soldered in the correct places.

Then the PCB is then flipped 180° such that the outer layer to which components previously have been soldered faces downwards. The process above is now repeated for the other outer layer, such that components are soldered to that layer as well in a second re-flow pass.

On the second outer layer 4, the first capacitor 22 constitutes a power reserve capacitor, and is a relatively large component without any significant impact regarding EMC. The inductor 26, which is arranged to be mounted to the first outer layer 3, is also a relatively heavy.

The capacitor 22 will likely fall off in a second pass of the re-flow process if it is added at a first pass of the re-flow process, i.e. if the second outer layer 4 first is processed according to the above and then flipped 180°. Therefore, only those components that stay soldered in place during the second pass of the reflow process when positioned upside-down are mounted to the second layer 4 for the re-flow process.

In that case, the inductor 26 would be added at the second pass, and would not have to be run through the re-flow process up-side down.

Alternatively, if the components of the first outer layer 4 are attached in the first pass of the re-flow process, the inductor 26 would likely fall off in the second pass of the re-flow process, where, instead the capacitor 22 would be added at the second pass of the re-flow process, not having to be turned up-side down during the re-flow process.

In order to avoid further passes of the re-flow process where those large components which would be positioned up-side down in the second pass of the re-flow process would be attached, this or these components, such as the first capacitor 22 and the inductor 26, are added after the second pass of the re-flow process by means of press-fit, where the component connector pins 21 are press-fitted in corresponding connector apertures in the PCB 2 such that both component retaining and electrical contact are achieved. The connector 19 is an example of another component that is suitable for press-fit in this case due to its weight.

Which components that should be positioned in which chamber may partly be determined by the available sizes of the chambers 29, 30 and the sizes of the components, as long as it is not detrimental to EMC. In the schematic Figures, the chambers 29, 30 have been shown relatively large in relation to the components, but in practice, the available space may be much more limited.

In the same way, the components have been shown with relatively sizes that only should be regarded schematically, and not as limiting in any way. The large inductor 26 may very well have such a relatively low weight that it may be positioned up-side down during a second pass of the re-flow process when it has been mounted previously, in the first pass of the re-flow process.

Furthermore, the components mentioned above are only mentioned as examples of suitable components with suitable positions in the electronic unit 1. For example, the connector 19 may at least partly be positioned in the first chamber 29 if for example this is required by means of the available space. However, preferably at least one capacitor 22, which may be a power reserve capacitor, is located in the second chamber 30, and all components dedicated to power supply and digital processes such as inductors and clock signal circuits are located in the first chamber 29.

The present invention is not limited to the above, but may vary freely within the scope of the appended claims. For example, if there is a component or components which is mounted after the re-flow process, said components need not be press-fitted, but may be glued, bonded or stuck to the PCB in any other convenient way.

The PCB 2 may have only two layers, where the first outer layer is made in such a way that the copper is preserved to such an extent that a virtual ground plane is obtained, providing sufficient EMI shielding. There may also be several layers in the PCB, which may include more than one ground plane and several signal and power feeding layers. Usually, such a configuration further increases EMI shielding. Furthermore, the most usual PCB configuration is an even number of layers, for example four layers.

The contact between the layer 5 functioning as ground plane and the first housing part 6 may be achieved in many ways, for example by means of a conducting paste or by means of resilient metal fingers protruding from the ground plane layer 5. The edges of the PCB may be plated where the plating is in electrical contact with the ground plane.

The electronic unit 1 may have any suitable shape, for example cylindrical. There may also be more or less walls in the housings 6, 7 than shown.

The first housing part 6 does not have to be made entirely in metal, but may be made in plastic with a metal insert, a metal enclosure or a metal coating on the inside or the outside. The metal does not have to be uniformly distributed, but it has to be of such a structure that EMI shielding is provided. Here, the inside of the first housing part 6 has the surfaces that face the PCB 2 when mounted, and the outside of the first housing part 6 has the surfaces that face away from the PCB 2 when mounted.

The PCB 2 may be any sort of suitable circuit board, being made from for example glass fiber or any other suitable plastic material, for example based on ceramic or polytetrafluoroethylene (PTFE).

All materials mentioned are only to be regarded as examples of suitable materials. Likewise, the components mentioned are only examples of possible components in an electronic unit provided to increase the understanding o the present invention. An electronic unit of this kind normally has many more components than those mentioned in the description.

The PCB may for example be attached to a slot or an indent (not shown) in the first housing part 6, or by means of PCB holding pillars 32, 33 indicated with dashed lines in FIG. 3.

While the above description constitutes the preferred embodiment of the present invention, it will be appreciated that the invention is susceptible to modification, variation and change without departing from the proper scope and fair meaning of the accompanying claims.

The invention claimed is:

1. An electronic unit comprising:
a circuit board, arranged to be mounted in a main housing, which main housing having a first housing part and a second housing part,
the circuit board having a first outer layer, a second outer layer, and an internal ground plane, where the outer layers are separated from the internal ground plane by at least a dielectric material,
where the first outer layer faces the first housing part and the second outer layer faces the second housing part,
wherein the ground plane is arranged to make electrical contact with the first housing part such that a first chamber facing the first outer layer, and a second chamber, facing the second outer layer, are formed,
where the first and second chambers are separated by means of the ground plane, such that an electromagnetic shielding is created between the first and second chambers, and
a connector arranged for establishing electrical contact between the electronic unit and parts outside the electronic unit, the connector having a number of connector pins and at least partly being positioned in the second chamber.

2. The electronic unit according to claim 1, further comprising wherein that where surfaces of the first housing part that face the circuit board are electrically conducting.

3. The electronic unit according to claim 1 further comprising in that the first housing part is made of a metal material.

4. The electronic unit according to claim 1, further comprising wherein that an electromagnetic interference filter arrangement is positioned at the connector pins.

5. The electronic unit according to claim 4, further comprising in that the electromagnetic interference filter arrangement having at least one capacitor.

6. The electronic unit according to claim 1, in that the connector is press-fitted between the first housing part and the second housing part.

7. The electronic unit according to claim 1 further comprising in that a first plurality of components is mounted on the first outer layer and a second plurality of components is mounted on the second outer layer, where all of the first plurality or the second plurality of components are mounted in a re-flow process and at least one component on the other of the first plurality or the second plurality of components is mounted by means of another process.

8. The electronic unit according to claim 7, further comprising in that said other process is one of press-fit, gluing, or bonding.

9. The electronic unit according to claim 7 further comprising in that one of the first or the second plurality of components includes components dedicated to power supply and digital processes, and that the other of the first or the second plurality of components includes a power reserve component.

10. The electronic unit according to claim 9, further comprising in that the components dedicated to power supply and digital processes include at least one inductor and at least one clock signal circuit, and that the power reserve component includes a capacitor.

11. The electronic unit according to claim 1 further comprising in that the first housing part is mounted to a part of a vehicle.

12. The electronic unit according to claim 1 further comprising in that the second housing part is made in a plastic material.

* * * * *